(12) United States Patent
Galbraith et al.

(10) Patent No.: US 12,050,352 B2
(45) Date of Patent: Jul. 30, 2024

(54) HEAT EXCHANGE ASSEMBLY FOR A PLUGGABLE MODULE

(71) Applicant: TE Connectivity Services GmbH, Schaffhausen (CH)

(72) Inventors: Zachary Galbraith, Hummelstown, PA (US); Christopher David Ritter, Hummelstown, PA (US); Alex Michael Sharf, Harrisburg, PA (US); Dean Marlin Harmon, III, Etters, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 690 days.

(21) Appl. No.: 17/024,183

(22) Filed: Sep. 17, 2020

(65) Prior Publication Data

US 2022/0082771 A1    Mar. 17, 2022

(51) Int. Cl.
| | | |
|---|---|---|
| G02B 6/42 | (2006.01) | |
| H01R 12/71 | (2011.01) | |
| H01R 12/72 | (2011.01) | |
| H01R 13/6594 | (2011.01) | |
| H05K 5/02 | (2006.01) | |
| H05K 7/20 | (2006.01) | |

(52) U.S. Cl.
CPC ......... *G02B 6/4269* (2013.01); *H01R 12/716* (2013.01); *H01R 12/722* (2013.01); *H01R 13/6594* (2013.01); *H05K 5/0286* (2013.01); *H05K 7/20418* (2013.01); *H05K 7/20436* (2013.01)

(58) Field of Classification Search
CPC .. G02B 6/4289; H01R 12/716; H01R 12/722; H01R 13/6594; H05K 5/0286; H05K 7/20418; H05K 7/20436
See application file for complete search history.

(56) References Cited

U.S. PATENT DOCUMENTS

| | | | | |
|---|---|---|---|---|
| 5,297,618 | A * | 3/1994 | Behun | H01L 23/4006 |
| | | | | 361/705 |
| 7,224,582 | B1 * | 5/2007 | Saturley | H05K 9/0049 |
| | | | | 361/679.54 |
| 7,224,587 | B2 * | 5/2007 | Dittus | H01L 23/4093 |
| | | | | 174/16.3 |
| 7,800,910 | B2 * | 9/2010 | Seynaeve | H05K 5/0286 |
| | | | | 165/185 |
| 8,223,497 | B2 * | 7/2012 | Sundstrom | H05K 7/20536 |
| | | | | 361/720 |
| 8,867,869 | B2 * | 10/2014 | Steijer | G02B 6/4259 |
| | | | | 257/E31.127 |

(Continued)

*Primary Examiner* — Peter Radkowski

(57) ABSTRACT

A pluggable module includes a housing having a top wall including an opening above a module cavity. The pluggable module includes a heat exchange assembly separate and discrete from the housing extending into the module cavity through the opening. The heat exchange assembly includes a thermal bridge having an upper thermal interface and a lower thermal interface. The thermal bridge includes a plurality of interleaved plates arranged in a plate stack with the plates being movable relative to each other in the plate stack. The lower thermal interface is in thermal communication with the electrical component to dissipate heat from the electrical component. The thermal bridge extends through the opening with the upper thermal interface exposed from above for dissipating heat from the heat exchange assembly.

22 Claims, 6 Drawing Sheets

(56) References Cited

U.S. PATENT DOCUMENTS

| | | | | |
|---|---|---|---|---|
| 8,870,471 B2* | 10/2014 | Ito | ................ | G02B 6/4269 |
| | | | | 385/88 |
| 9,275,931 B2* | 3/2016 | Chen | ................ | H01L 21/4882 |
| 9,343,851 B2* | 5/2016 | Bucher | ................ | H01R 12/722 |
| 9,620,890 B1* | 4/2017 | Vino, IV | ................ | G02B 6/4293 |
| 9,668,380 B2* | 5/2017 | Bucher | ................ | H05K 1/0203 |
| 9,681,582 B1* | 6/2017 | Bucher | ................ | G02B 6/4272 |
| 9,791,647 B2* | 10/2017 | Steijer | ................ | G02B 6/4272 |
| 9,946,315 B2* | 4/2018 | Degner | ................ | G08B 21/18 |
| 10,477,729 B2* | 11/2019 | Han | ................ | F28F 3/06 |
| 10,806,054 B1* | 10/2020 | Mahalingam | ................ | H05K 7/2049 |
| 11,240,934 B1* | 2/2022 | Bucher | ................ | H05K 1/0203 |
| 11,439,042 B2* | 9/2022 | Bucher | ................ | H01L 23/4338 |
| 2005/0281001 A1* | 12/2005 | Dittus | ................ | H01L 23/4093 |
| | | | | 361/710 |
| 2009/0279261 A1* | 11/2009 | Seynaeve | ................ | H05K 7/20454 |
| | | | | 361/704 |
| 2011/0058336 A1* | 3/2011 | Sundstrom | ................ | H05K 7/20436 |
| | | | | 361/710 |
| 2012/0063718 A1* | 3/2012 | Steijer | ................ | G02B 6/4269 |
| | | | | 385/14 |
| 2013/0180697 A1* | 7/2013 | Chen | ................ | H01L 21/4882 |
| | | | | 165/185 |
| 2014/0286613 A1* | 9/2014 | Ito | ................ | G02B 6/4292 |
| | | | | 385/88 |
| 2016/0064873 A1* | 3/2016 | Bucher | ................ | H01R 13/6658 |
| | | | | 439/59 |
| 2017/0023751 A1* | 1/2017 | Steijer | ................ | G02B 6/4272 |
| 2017/0094830 A1* | 3/2017 | Bucher | ................ | H05K 7/20445 |
| 2017/0164511 A1* | 6/2017 | Bucher | ................ | G02B 6/4272 |
| 2017/0300095 A1* | 10/2017 | Degner | ................ | H05K 7/20209 |
| 2019/0230817 A1* | 7/2019 | Han | ................ | G02B 6/4269 |
| 2021/0084791 A1* | 3/2021 | Bucher | ................ | H05K 7/205 |
| 2022/0030739 A1* | 1/2022 | Bucher | ................ | H05K 7/20472 |

* cited by examiner

HEAT EXCHANGE ASSEMBLY FOR A PLUGGABLE MODULE

BACKGROUND OF THE INVENTION

The subject matter herein relates generally to pluggable module assemblies.

Some communication systems utilize transceivers or pluggable modules as I/O modules for data communication. The pluggable module is pluggably received in a receptacle cage of a receptacle assembly to interconnect the pluggable module with a host circuit board, such as through a communication connector mounted to the host circuit board. During operation, the pluggable module generates heat. Heat dissipation is difficult from the pluggable modules. Some known communication systems include a heat sink, cold plate or other heat transfer device coupled to the receptacle cage that interfaces with the housing of the pluggable module to dissipate heat from the pluggable module. However, at higher data rates, known heat transfer devices are proving to be insufficient.

A need remains for a heat exchange assembly for a pluggable module for efficiently dissipating heat from the pluggable module.

BRIEF DESCRIPTION OF THE INVENTION

In one embodiment, a pluggable module is provided. The pluggable module is configured to be plugged into a cage of receptacle assembly. The pluggable module includes a housing having a top wall, a bottom wall and sidewalls between the top wall and the bottom wall. The housing forms a module cavity. The top wall has an opening above the module cavity. The housing has a mating end configured to be mated with a communication connector of the receptacle assembly. The pluggable module includes a module circuit board received in the module cavity. The module circuit board has an electrical component mounted to an upper surface of the module circuit board. The pluggable module includes a heat exchange assembly separate and discrete from the housing. The heat exchange assembly is received in the opening and extends into the module cavity. The heat exchange assembly includes a thermal bridge having an upper thermal interface and a lower thermal interface. The thermal bridge includes a plurality of interleaved plates arranged in a plate stack with the plates being movable relative to each other in the plate stack. The lower thermal interface is in thermal communication with the electrical component to dissipate heat from the electrical component. The thermal bridge extends through the opening with the upper thermal interface exposed from above the housing for heat dissipation from the heat exchange assembly.

In another embodiment, a pluggable module is provided. The pluggable module is configured to be plugged into a cage of receptacle assembly. The pluggable module includes a housing having a top wall, a bottom wall and sidewalls between the top wall and the bottom wall. The housing forms a module cavity. The top wall has an opening above the module cavity. The housing has a mating end configured to be mated with a communication connector of the receptacle assembly. A module circuit board is received in the module cavity. The module circuit board has an electrical component mounted to an upper surface of the module circuit board. The pluggable module includes a heat exchange assembly separate and discrete from the housing, the heat exchange assembly being received in the opening and extending into the module cavity. The heat exchange assembly includes a thermal bridge having an upper bridge element and a lower bridge element movable relative to the upper bridge element and thermally coupled to the upper bridge element. The upper bridge element includes upper plates arranged in an upper plate stack. The upper bridge element includes upper channels between corresponding upper plates. The lower bridge element includes lower plates arranged in a lower plate stack. The lower bridge element includes lower channels between corresponding lower plates. The lower plates are received in corresponding upper channels and the upper plates are received in corresponding lower channels to interleave the upper plates and the lower plates for thermal exchange between the lower bridge element and the upper bridge element. The lower bridge element has a lower thermal interface that is in thermal communication with the electrical component to dissipate heat from the electrical component. The upper bridge element extends through the opening and has an upper thermal interface exposed from above the housing for interfacing with a thermal transfer device associated with the cage. The upper bridge element is compressible toward the lower bridge element when interfacing with the thermal transfer device of the receptacle assembly.

In a further embodiment, a communication system is provided. The communication system includes a receptacle assembly having a cage and a thermal transfer device associated with the cage. The cage forms a module channel. The receptacle assembly has a communication connector received in the cage at a rear of the module channel. The communication system includes a pluggable module received in the module channel and is mated with the communication connector. The pluggable module includes a housing having a top wall, a bottom wall and sidewalls between the top wall and the bottom wall. The housing forms a module cavity. The top wall has an opening above the module cavity. The housing has a mating end mated with the communication connector of the receptacle assembly. A module circuit board is received in the module cavity. The module circuit board has an electrical component mounted to an upper surface of the module circuit board. The module circuit board has an edge received in a card slot of the communication connector. A heat exchange assembly is separate and discrete from the housing. The heat exchange assembly is received in the opening and extends into the module cavity. The heat exchange assembly includes a thermal bridge having an upper thermal interface and a lower thermal interface. The thermal bridge includes a plurality of interleaved plates arranged in a plate stack with the plates being movable relative to each other in the plate stack. The lower thermal interface is in thermal communication with the electrical component to dissipate heat from the electrical component. The thermal bridge extends through the opening. The upper thermal interface is exposed from above the housing for interfacing with the thermal transfer device associated with the cage. The upper thermal interface is compressible toward the module cavity when interfacing with the thermal transfer device of the receptacle assembly.

DETAILED DESCRIPTION OF THE INVENTION

Figure 1:
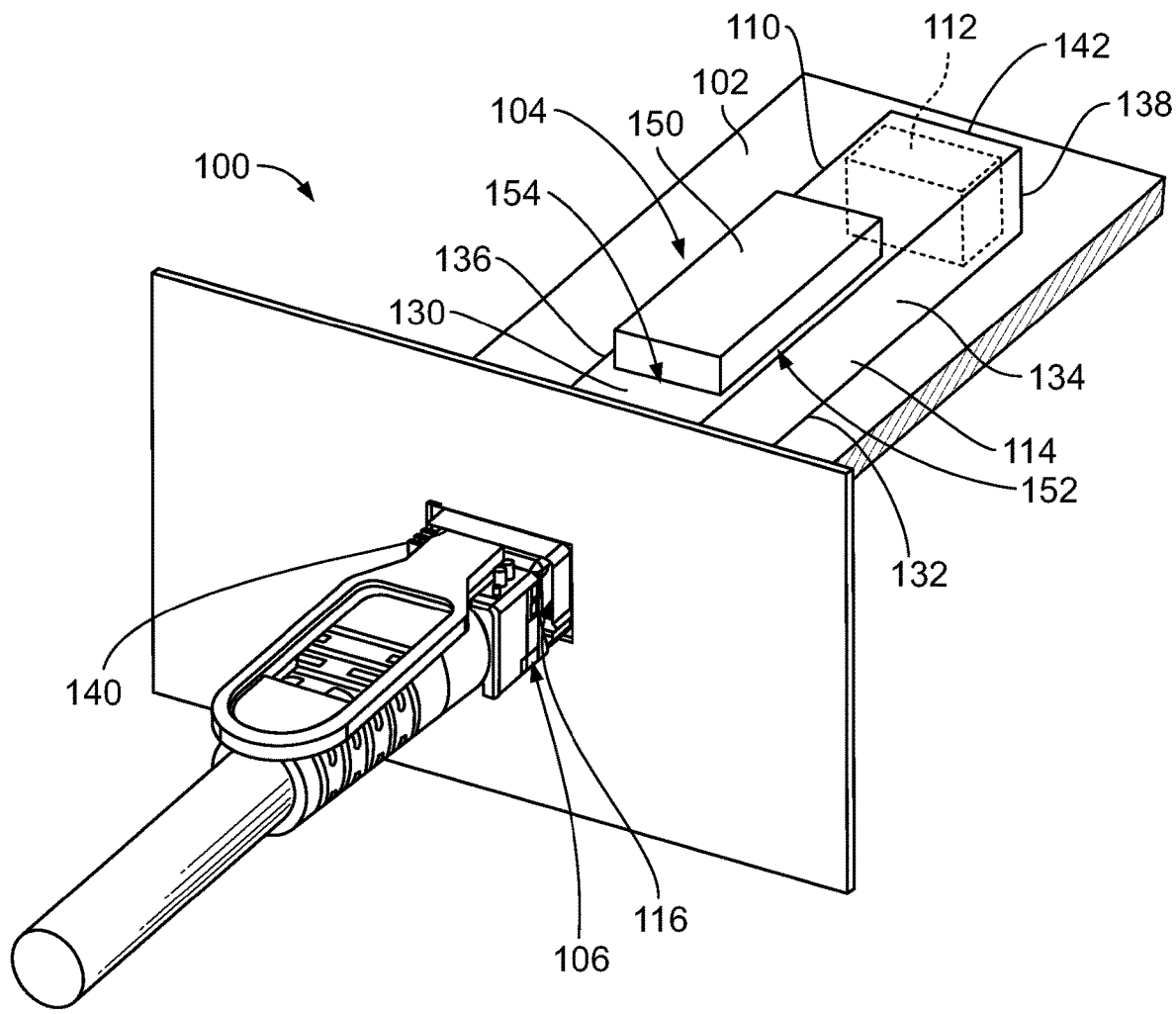
FIG. 1 is a top perspective view of a communication system formed in accordance with an exemplary embodiment.

FIG. 1 is a top perspective view of a communication system 100 formed in accordance with an exemplary embodiment. The communication system 100 includes a circuit board 102 (FIG. 1) and a receptacle connector assembly 104 mounted to the circuit board 102. A pluggable module 106 (FIG. 1) is electrically connected to the receptacle connector assembly 104. The pluggable module 106 is electrically connected to the circuit board 102 through the receptacle connector assembly 104. The pluggable module 106 includes a heat exchange assembly 200 (shown in FIG. 4) for dissipating heat from components of the pluggable module 106. The heat exchange assembly 200 may dissipate heat into a heat exchanger of the receptacle connector assembly 104 or may dissipate heat directly into the air around the receptacle connector assembly 104.

In an exemplary embodiment, the receptacle connector assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110.

In various embodiments, the receptacle cage 110 is enclosed and provides electrical shielding for the communication connector 112. The receptacle cage 110 is configured to surround at least a portion of the pluggable module 106 to provide shielding for the pluggable module 106. The receptacle cage 110 includes a plurality of cage walls 114 that define one or more module channels 116 for receipt of corresponding pluggable modules 106. The cage walls 114 may be walls defined by solid sheets, perforated walls to allow airflow therethrough, walls with cutouts, such as for a heat transfer device such as a heatsink, heat spreader, cold plate, and the like to pass therethrough, or walls defined by rails or beams with relatively large openings, such as for airflow therethrough. In the illustrated embodiment, the receptacle cage 110 is a shielding, stamped and formed cage member with the cage walls 114 being shielding walls.

In the illustrated embodiment, the receptacle cage 110 includes a single module channel 116 for receiving a single pluggable module 106. The receptacle cage 110 has a port that is open at the front of the receptacle cage 110 to receive the pluggable module 106. Any number of module channels 116 may be provided in various embodiments. For example, the receptacle cage 110 may constitute a stacked cage member having upper and lower module channels 116 to receive multiple pluggable modules 106 in a stacked arrangement in an alternative embodiment. The upper and lower module channels 116 may be arranged in a single column; however, the receptacle cage 110 may include multiple columns of ganged module channels 116 in alternative embodiments (for example, 2×2, 3×2, 4×2, 4×3, etc.). In other various embodiments, rather than being a stacked cage member, the receptacle cage 110 may include ganged module channels 116 in a single row (for example, 1×2, 1×4, etc.). Optionally, multiple communication connectors 112 may be arranged within the receptacle cage 110, such as when multiple columns or rows of module channels 116 are provided.

In an exemplary embodiment, the cage walls 114 of the receptacle cage 110 include a top wall 130, a bottom wall 132, a first side wall 134, a second side wall 136 and a rear wall 138. The bottom wall 132 may rest on the circuit board 102. However, in alternative embodiments, the receptacle cage 110 may be provided without the bottom wall 132. The receptacle cage 110 extends between a front end 140 and a rear end 142. The port(s) is provided at the front end 140 to receive the pluggable module 106 through the front end 140. The cage walls 114 define a cavity. For example, the cavity may be defined by the top wall 130, the bottom wall 132, the side walls 134, 136 and the rear wall 138. The cavity defines the module channel 116 that receives the pluggable module 106. The cavity receives the communication connector 112. Other cage walls 114 may separate or divide the cavity into a plurality of module channels 116, such as stacked or ganged module channels. For example, the cage walls 114 may include a divider (not shown), such as a horizontal divider (for example, a separator plate), positioned between upper and lower module channels 116 or a vertical separator panel (not shown), such as parallel to the side walls 134, 136.

In an exemplary embodiment, the receptacle connector assembly 104 includes a thermal transfer device 150. The thermal transfer device 150 is used for dissipating heat from the pluggable module 106. For example, the thermal transfer device 150 may be coupled to the top wall 130 of the receptacle cage 110 for engaging the top of the pluggable module 106. The thermal transfer device 150 may dissipate the heat into the exterior environment, such as through airflow over the thermal transfer device 150. For example, the thermal transfer device 150 may include heat dissipating fins at the top, such as vertical plates or posts, extending from the top. The fins allow airflow through the thermal transfer device 150. The fins add surface area for the thermal transfer device 150 to enhance heat dissipation into the external environment. In other various embodiments, the thermal transfer device 150 may dissipate heat into a cooling fluid, such as water or refrigerant passing through the thermal transfer device 150. For example, the thermal transfer device 150 may include channels and/or pipes. The thermal transfer device 150 may be a solid block in various embodiments.

The thermal transfer device 150 includes a thermal interface 152 at a bottom of the thermal transfer device 150 for interfacing with the pluggable module 106. The thermal interface 152 may be planar in various embodiments. A thermal interface material (TIM) may be provided at the thermal interface 152 in various embodiments. The thermal transfer device 150 may extend through an opening 154 in the top wall 130 to directly engage the pluggable module 106. The thermal transfer device 150 may be a riding heat sink being spring biased downward to maintain positive pressure against the pluggable module 106 and ensure that the thermal transfer device 150 remains in direct thermal contact with the pluggable module 106. Other types of thermal transfer devices may be used in alternative embodiments, such as a heat spreader, a cold plate having a liquid cooling circuit, and the like. In other various embodiments, the receptacle connector assembly 104 is provided without the thermal transfer device 150. Rather, the heat exchange assembly 200 of the pluggable module 106 extends to the external environment for heat dissipation directly to the air round the receptacle cage 110. For example, the heat exchange assembly 200 may include heat dissipating fins rather than providing the heat dissipating fins o the separate thermal transfer device.

In an exemplary embodiment, the communication connector 112 is received in the cavity of the receptacle cage 110, such as proximate to the rear wall 138. However, in alternative embodiments, the communication connector 112 may be located behind the rear wall 138 exterior of the receptacle cage 110 and extend into the cavity to interface with the pluggable module(s) 106. For example, the rear wall 138 may include an opening to receive components therethrough.

In an exemplary embodiment, the pluggable modules 106 are loaded into the receptacle cage 110 through the front end 140 to mate with the communication connector 112. The shielding cage walls 114 of the receptacle cage 110 provide electrical shielding around the communication connector 112 and the pluggable modules 106, such as around the mating interfaces between the communication connector 112 and the pluggable modules 106.

In various embodiments, a gasket (not shown) may be provided at the front end 140 to interface with the pluggable module 106. For example, gasket fingers may interface with the pluggable module 106 to electrically common the receptacle cage 110 and the pluggable module 106. The gasket fingers span across any space between the cage walls 114 and the pluggable module 106 to prevent EMI leakage along the cage walls 114 and/or the walls of the pluggable module 106. The gasket may interface with an exterior component, such as a panel or chassis that receives the receptacle cage 110.

Figure 2:
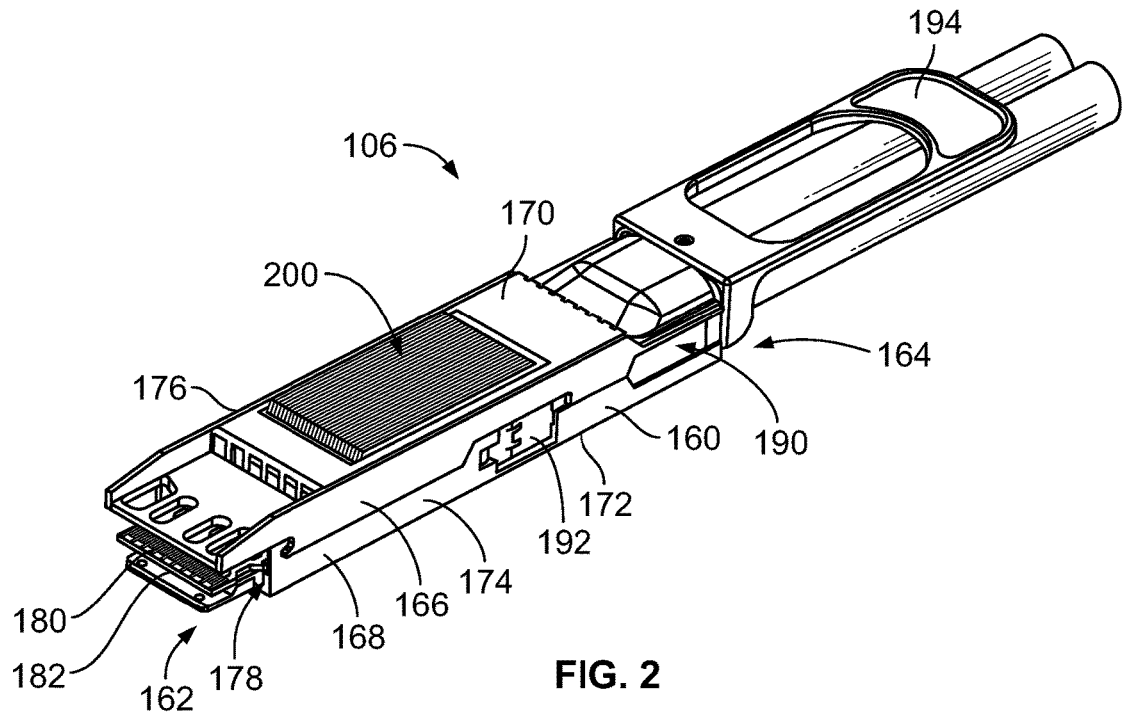
FIG. 2 is a perspective view of the pluggable module in accordance with an exemplary embodiment.
Figure 3:
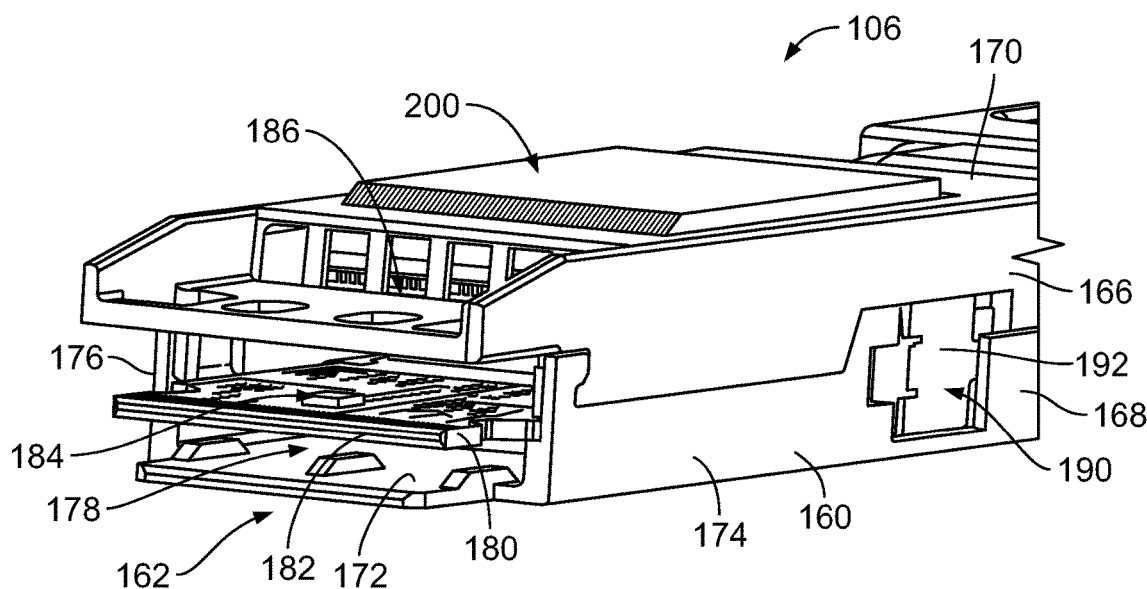
FIG. 3 is an enlarged view of a portion of the pluggable module in accordance with an exemplary embodiment.

FIG. 2 is a perspective view of the pluggable module 106 in accordance with an exemplary embodiment. FIG. 3 is an enlarged view of a portion of the pluggable module 106. The pluggable module 106 has a housing 160 and a heat exchange assembly 200 coupled to the housing 160. The heat exchange assembly 200 is used for dissipating heat from the electrical components of the pluggable module 106. The heat exchange assembly 200 is configured to be thermally coupled to the thermal transfer device 150 (shown in FIG. 1). In an exemplary embodiment, the heat exchange assembly 200 has flexible interfaces for interfacing with the electrical components of the pluggable module 106 and the thermal transfer device 150. The heat exchange assembly 200 is manufactured from a thermally conductive material for efficient thermal transfer between the electrical component of the pluggable module 106 and the thermal transfer device 150.

The housing 160 is defined by one or more shells, such as an upper shell 166 and a lower shell 168. The housing 160 may be thermally conductive and/or may be electrically conductive, such as to provide EMI shielding for the pluggable module 106. The housing 160 includes a mating end 162 and an opposite front end 164. The mating end 162 is configured to be inserted into the corresponding module channel 116 (shown in FIG. 1). The front end 164 is configured to extend from the front end of the receptacle cage 110 (shown in FIG. 1) when the pluggable module 106 is plugged into the receptacle cage 110. The front end 164 may be a cable end having a cable extending therefrom to another component within the system.

The housing 160 includes a top wall 170, a bottom wall 172, a first side wall 174 extending between the top wall 170 and the bottom wall 172, and a second side wall 176 extending between the top wall 170 and the bottom wall 172. The top wall 170 is part of the upper shell 166 and the bottom wall 172 is part of the lower shell 168. The first side wall 174 may be defined by the upper shell 166 and/or the lower shell 168. The second side wall 176 may be defined by the upper shell 166 and/or the lower shell 168. For example, in an exemplary embodiment, the upper and lower shells 166, 168 meet at an interface approximate centered along the side walls 174, 176. The housing 160 surrounds a module cavity 178. The module cavity 178 houses electrical components of the pluggable module 106. The cables may extend into the module cavity 178 for termination to the electrical components.

In an exemplary embodiment, the pluggable module 106 includes a module circuit board 180 in the module cavity 178. The module circuit board 180 may be accessible at the mating end 162. The module circuit board 180 is configured to be communicatively coupled to the communication connector 112 (shown in FIG. 1). For example, a mating edge 182 of the module circuit board 180 may be plugged into the communication connector 112, such as in a card slot of the communication connector 112. The module circuit board 180 includes electrical components 184 used for operating and/or using the pluggable module 106. For example, the module circuit board 180 may have conductors, traces, pads, electronics, sensors, controllers, switches, inputs, outputs, and the like associated with the module circuit board 180, which may be mounted to the module circuit board 180, to form various circuits. The electrical component(s) 184 is a heat generating component. For example, the electrical component 184 generates heat when transmitting data. In an exemplary embodiment, the electrical component 184 may include a processor, a memory module, an electronic package, a chip, and the like.

In an exemplary embodiment, the heat exchange assembly 200 provides heat transfer for the module circuit board 180 and the electrical components 184 on the module circuit board 180. For example, the module circuit board 180 is in thermal communication with the heat exchange assembly 200 and the heat exchange assembly 200 transfers heat away from the module circuit board 180 and the electrical components 184. The heat exchange assembly 200 may be thermally coupled to the electrical components 184 through a thermal exchanger 186. In various embodiments, the thermal exchanger 186 may be defined by the electrical component 184. For example, the heat exchange assembly 200 may directly engage one or more of the electrical components 184 for dissipating heat from the electrical components 184. In other various embodiments, the thermal exchanger 186 may be thermally coupled to the electrical components 184 by an indirect thermal connection, such as through the housing 160 or other intervening thermally conductive structure.

The pluggable module 106 includes a latch 190 for releasing the pluggable module 106 from the receptacle cage 110. The latch 190 includes a pull tab 194 extending between slider arms 192. A tether (not shown) may extending rearward from the pull tab 194. The pull tab 194 is configured to be pulled rearward to release the latch 190 and allow removal of the pluggable module 106 from the receptacle cage 110.

Figure 4:
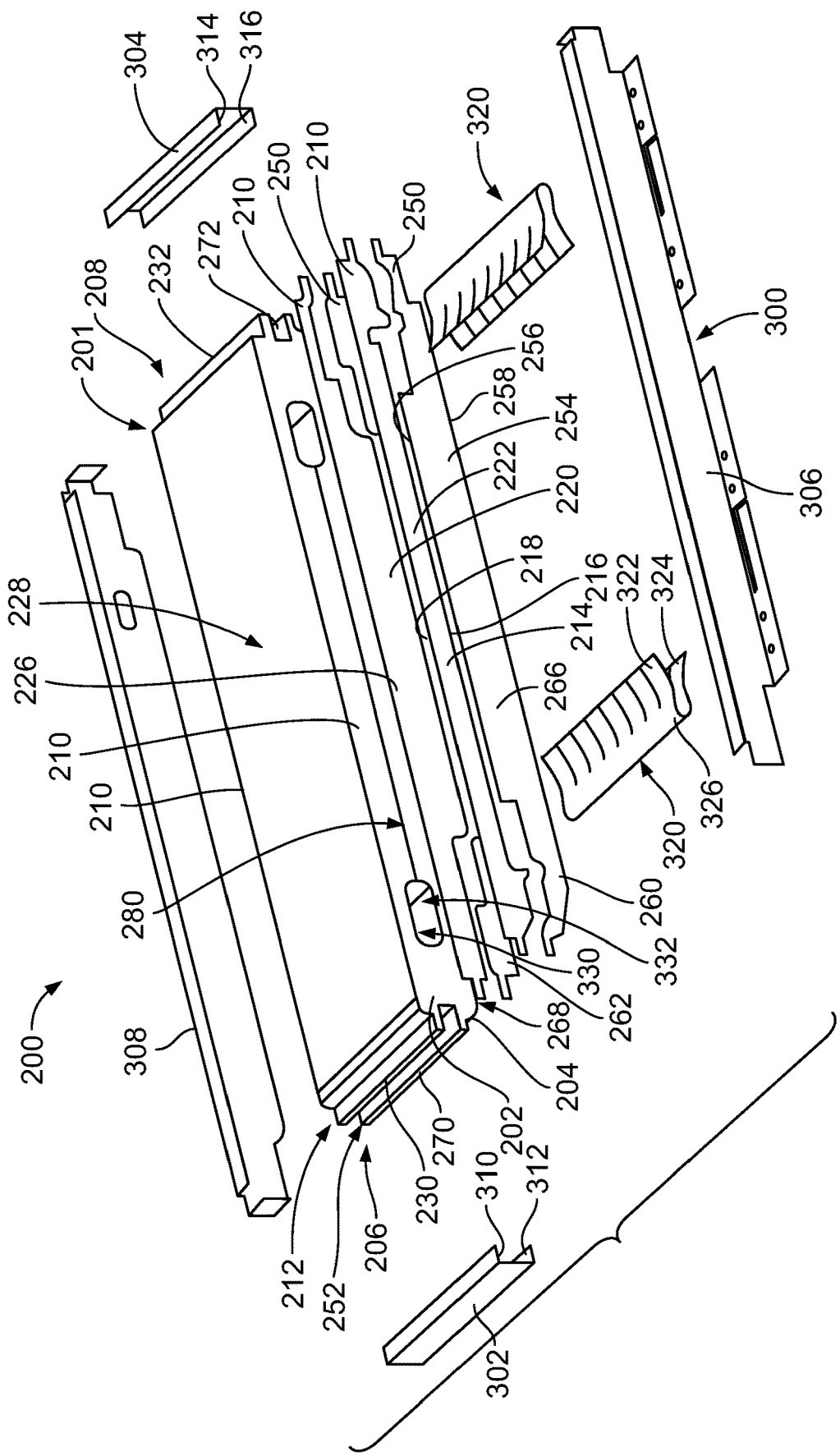
FIG. 4 is an exploded view of the heat exchange assembly in accordance with an exemplary embodiment.
Figure 5:
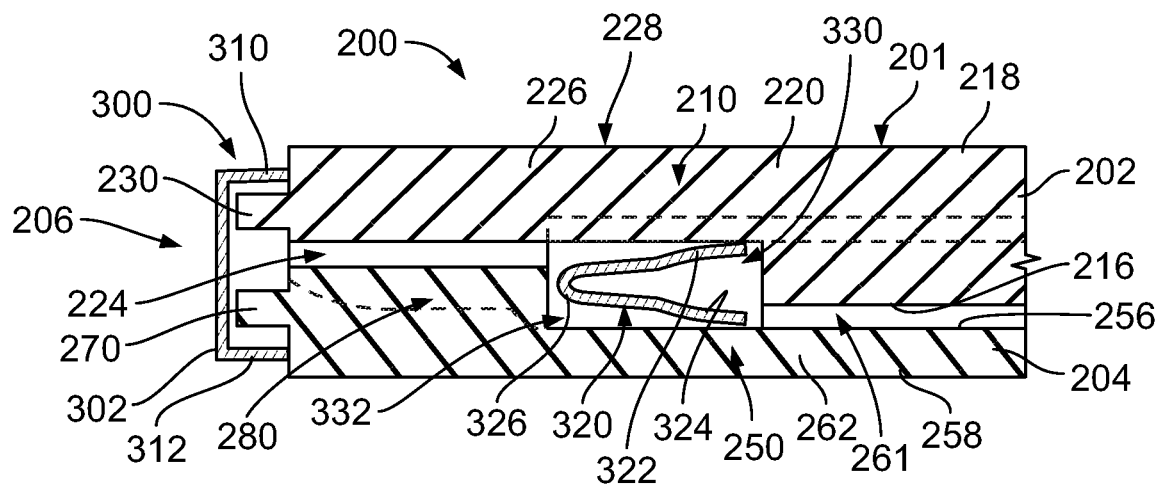
FIG. 5 is an assembled view of the heat exchange assembly in accordance with an exemplary embodiment.
Figure 6:
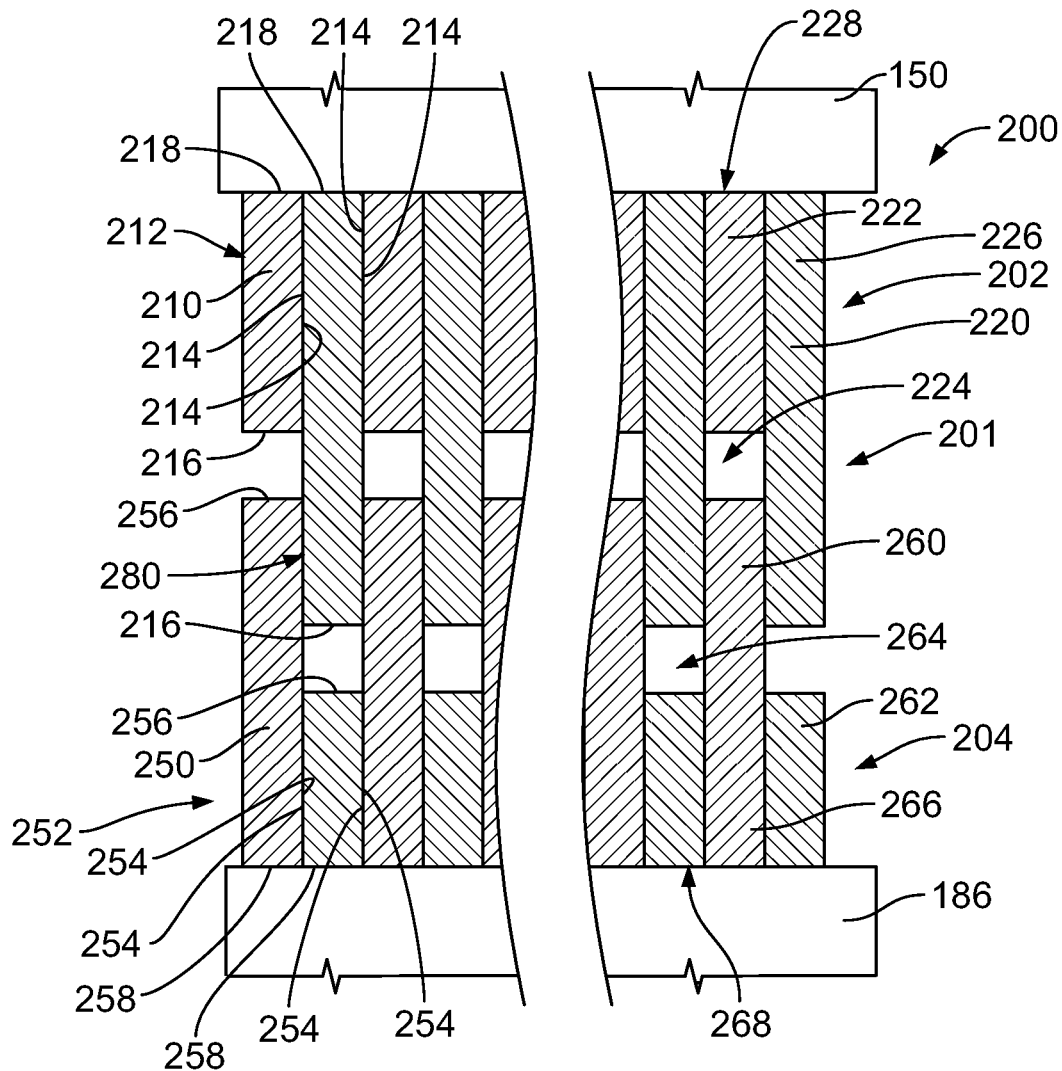
FIG. 6 is a cross-sectional view of the heat exchange assembly in accordance with an exemplary embodiment.

FIG. 4 is an exploded view of the heat exchange assembly 200 in accordance with an exemplary embodiment. FIG. 5 is a side view of the heat exchange assembly 200 in an assembled state in accordance with an exemplary embodiment. FIG. 6 is a cross-sectional view of the heat exchange assembly 200 in accordance with an exemplary embodiment. The heat exchange assembly 200 includes a thermal bridge 201 and a bridge frame 300 used to hold the thermal bridge 201. The bridge frame 300 may be coupled to the housing 160 of the pluggable module 106 (shown in FIG. 2) to position the thermal bridge 201 for interfacing with the thermal exchanger 186 and the thermal transfer device 150 (shown in FIG. 1). In alternative embodiments, the thermal bridge 201 may extend from the thermal exchanger 186 into the external environment to dissipate the heat directly to the air rather than interfacing with the thermal transfer device 150.

In an exemplary embodiment, the thermal bridge 201 includes an upper bridge element 202, a lower bridge element 204, and a spring element 320 located between the upper and lower bridge elements 202, 204. The lower bridge element 204 is configured to thermally engage the thermal exchanger 186. The upper bridge element 202 is configured to engage the thermal transfer device 150. The upper bridge element 202 is in thermal communication with the lower bridge element 204 and dissipates heat away from the lower bridge element 204 to cool the thermal exchanger 186 and thus the electrical component 184. Optionally, the upper and lower bridge elements 202, 204 may be positioned relative to each other to allow some airflow through the thermal bridge 201. In an exemplary embodiment, the upper and lower bridge elements 202, 204 are movable relative to each other, such as to allow alignment of the upper and lower bridge elements 202, 204 with the thermal transfer device 150 and the thermal exchanger 186, respectively. The upper and lower bridge elements 202, 204 may be movable to allow thermal expansion and thermal contraction of the thermal exchanger 186 and/or the thermal transfer device 150.

The spring elements 320 are located between the upper and lower bridge elements 202, 204. In an exemplary embodiment, the spring elements 320 are located at a front end 206 (shown in FIG. 1) of the thermal bridge 201 and at a rear end 208 of the thermal bridge 201. Other locations are possible in alternative embodiments. The spring elements 320 force the upper and lower bridge elements 202, 204 apart from each other. The spring elements 320 force the upper bridge element 202 in a first biasing direction, such as upward, toward the thermal transfer device 150. For example, the spring elements 320 force the upper bridge element 202 into thermal contact with the thermal transfer device 150. The spring elements 320 force the lower bridge element 204 in a second biasing direction, such as downward, toward the thermal exchanger 186. For example, the spring elements 320 force the lower bridge element 204 into thermal contact with the thermal exchanger 186.

In an exemplary embodiment, each spring element 320 is a stamped and formed part. The spring element 320 may be manufactured from a thin metal material such that the spring element 320 is flexible. The spring element 320 includes an upper spring arm 322, a lower spring arm 324 and a folded portion 326 between the upper and lower spring arms 322, 324. The folded portion 326 may be U-shaped or V-shaped in various embodiments. The folded portion 326 is flexible and configured to spread the upper and lower spring arms 322, 324 apart when the folded portion is flexed or compressed.

When installed, the upper spring arm 322 is biased upward against the upper bridge element 202 and the lower spring arm 322 is biased downward against the lower bridge element 204. The spring element 320 is compressible and expandable. For example, the upper and lower spring arms 322, 324 may be compressed relatively toward each other and may be expanded relatively away from each other. In various embodiments, the upper spring arm 322 and/or the lower spring arm 324 and/or the folded portion 326 may be segmented to allow relative independent movement of the segments.

In an exemplary embodiment, the bridge elements 202, 204 each include a plurality of plates that are arranged together in plate stacks. The plates are interleaved with each other for thermal communication between the upper bridge element 202 and the lower bridge element 204. The individual plates are movable relative to each other such that the plates may be individually articulated to conform to the upper surface of the thermal exchanger 186 and the lower surface of the thermal transfer device 150 for improved contact and/or proximity of the thermal bridge 201 with the thermal exchanger 186 and the thermal transfer device 150.

In an exemplary embodiment, the upper bridge element 202 includes a plurality of upper plates 210 arranged in an upper plate stack 212. Each upper plate 210 has sides 214 extending between a lower end or an inner end 216 and an outer end or upper end 218 of the upper plate 210. The inner end 216 faces the lower bridge element 204. The upper end 218 faces the thermal transfer device 150. Optionally, various upper plates 210 may have different heights between the inner ends 216 and the upper ends 218. For example, some of the upper plates 210 may be taller to form upper fin plates 220 for the thermal bridge 201 and some of the upper plates 210 may be shorter to form upper spacer plates 222. The upper spacer plates 222 are located between the upper fin plates 220. The upper fin plates 220 form upper channels 224 therebetween. The upper spacer plates 222 are received in corresponding upper channels 224.

In an exemplary embodiment, each upper plate 220 includes a base 226 at the upper end 218. The base 226 is aligned with the upper spacer plates 222. The sides 214 of the upper fin plates 220 at the bases 226 face the sides 214 of the upper spacer plates 222. The upper spacer plates 222 are thermally coupled to the bases 226 of the upper fin plates 220 to transfer heat across the entire upper end of the upper bridge element 202 for efficient heat transfer to the thermal transfer device 150. The upper end of the upper bridge element 202 defines an upper thermal interface 228 for interfacing with the thermal transfer device 150. For example, the upper ends 218 of the upper plates 210 are stacked together to define the upper thermal interface 228. In alternative embodiments, the upper thermal interface 228 may dissipate heat directly into the air in the external environment rather than interfacing with the separate thermal transfer device 150. For example, the upper fin plates 220 may extend above the upper surfaces of the spacer plates 222 to form heat dissipating fins for the thermal bridge 201.

In an exemplary embodiment, the lower bridge element 204 includes a plurality of lower plates 250 arranged in a lower plate stack 252. Each lower plate 250 has sides 254 extending between an upper end or an inner end 256 and a lower end or an outer end 258 of the lower plate 250. The inner end 256 faces the upper bridge element 202. The lower end 258 faces the thermal exchanger 186. Optionally, various lower plates 250 may have different heights between the inner ends 256 and the outer ends 258. For example, some of the lower plates 250 may be taller to form lower fin plates 260 for the thermal bridge 201 and some of the lower plates 250 may be shorter to form lower spacer plates 262. The lower spacer plates 262 are located between the lower fin plates 260. The lower fin plates 260 form lower channels 264 therebetween. The lower spacer plates 262 are received in corresponding lower channels 264.

In an exemplary embodiment, each lower fin plate 260 includes a base 266 at the lower end 258. The base 266 is aligned with the lower spacer plates 262. The sides 254 of the lower fin plates 260 at the bases 266 face the sides 254 of the lower spacer plates 262. The lower spacer plates 262 are thermally coupled to the bases 266 of the lower fin plates 260 to transfer heat across the entire lower end of the lower bridge element 204 for efficient heat transfer from the thermal exchanger 186. The lower end of the lower bridge element 204 defines a lower thermal interface 268 for interfacing with the thermal exchanger 186. For example, the lower ends 258 of the lower plates 250 are stacked together to define the lower thermal interface 268.

When assembled, the upper plates 210 are interleaved with the lower plates 250. The upper and lower plates 210, 250 are held in the frame 300, such as stacked or sandwiched together between opposite sides and ends of the frame 300. The upper and lower plates 210, 250 are held in vertical orientations in the frame. The upper fin plates 220 are received in the lower channels 264 and the lower fin plates 260 are received in the upper channels 224. For example, the upper fin plates 220 may be aligned with the lower spacer plates 262 across the lower channels 264 and the lower fin plates 260 may be aligned with the upper spacer plates 222 across the upper channels 224.

In an exemplary embodiment, the upper fin plates 220 interface with the lower fin plates 260 at a thermal bridge interface 280. The upper bridge element 202 is thermally coupled to the lower bridge element 204 at the thermal bridge interface 280. The sides 214 face the sides 254 at the thermal bridge interface 280. The sides 214, 254 are overlapping by an overlap distance sufficient to allow efficient thermal transfer between the lower plates 250 and the upper plates 210. The sides 214, 254 are slidable relative to each other to allow movement between the upper plates 210 and the lower plates 250 and change the overlap distance. In an exemplary embodiment, the upper fin plates 220 are movable relative to the lower fin plates 260 at the thermal bridge interface 280, such as during mating of the upper plates 210 with the thermal transfer device 150 and/or thermal expansion and thermal contraction of the thermal exchanger 186 and/or the thermal transfer device 150. The upper channels 224 and the lower channels 264 accommodate relative movement of the upper fin plates 220 and the lower fin plates 260.

During assembly, the spring elements 320 are located between the upper and lower bridge elements 202, 204, such as in upper spring pockets 330 and lower spring pockets 332 of the upper and lower bridge elements 202, 204, respectively. The spring pockets 330, 332 may be located proximate to the front end 206 and proximate to the rear end 208 of the thermal bridge 201 for receiving corresponding spring elements 320. The spring elements 320 are used to position the upper and lower bridge elements 202, 204 relative to each other for mounting to the thermal transfer device 150 and the thermal exchanger 186, respectively. The spring elements 320 force the upper bridge element 202 into the thermal transfer device 150 and force the lower bridge element 204 into the thermal exchanger 186. The folded portion 326 is flexible and configured to spread the upper and lower spring arms 322, 324 apart to provide the outward biasing forces on the upper and lower bridge elements 202, 204. The upper spring arms 322 are configured to engage each of the upper plates 210. The lower spring arms 324 are configured to engage each of the lower plates 250.

The bridge frame 300 is used to hold the thermal bridge 201 together. The bridge frame 300 holds the upper plates 210 and the upper plate stack 212. The bridge frame 300 holds the lower plates 250 in the lower plate stack 252. The bridge frame 300 holds the upper plates 210 interleaved with the lower plates 250. The bridge frame 300 maintains the overall structure of the thermal bridge 201.

The bridge frame 300 is configured to be coupled to the upper bridge element 202 and/or the lower bridge element 204. The bridge frame 300 is used to hold the upper bridge element 202 relative to the lower bridge element 204. Optionally, the bridge frame 300 limits lateral movement of the upper bridge element 202 and/or the lower bridge element 204. The bridge frame 300 may be used to limit lateral movement of the upper bridge element 202 and/or the lower bridge element 204. In an exemplary embodiment, the upper bridge element 202 and/or the lower bridge element 204 may be movable vertically within the bridge frame 300, such as to allow thermal expansion and thermal contraction of the thermal exchanger 186 and/or the thermal transfer device 150. For example, the bridge frame 300 may allow a limited amount of floating movement of the upper bridge element 202 and/or the lower bridge element 204 within the bridge frame 300.

In an exemplary embodiment, the bridge frame 300 includes a front end rail 302, a rear end rail 304, a first side rail 306, and a second side rail 308. The side rails 306, 308 extend between the end rails 302, 304. The side rails 306, 308 extend generally parallel to the plates 210, 250. The side rails 306, 308 tightly hold the plates 210, 250 in the stacked configurations. The end rails 302, 304 support the front ends and the rear ends of the plates 210, 250 while allowing a limited amount of floating movement of the plates 210, 250 relative to each other and the bridge frame 300.

In an exemplary embodiment, the front end rail 302 includes an upper cap 310 and a lower cap 312 and the rear end rail 304 includes an upper cap 314 and a lower cap 316. Spaces are provided between the caps 310, 312 and the caps 314, 316 that receive and retain the plates 210, 250 therein. For example, the upper plates 210 may include front locating fingers 230 and rear locating fingers 232. The lower plates 250 include front locating fingers 270 and rear locating fingers 272. The front locating fingers 230, 270 are received in the space between the caps 310, 312 at the front. The rear locating fingers 232, 272 are received in the space between the caps 314, 316 at the rear. The end rails 302, 304 allow the limited floating movement of the upper plates 210 and/or the lower plates 250. For example, the caps 310, 312 may be spaced apart by a distance that allows the upper plates 210 and the lower plates 250 to be spread apart from each other by the spring elements 320. The caps 310, 312, 314, 316 define outer stops for movement of the upper and lower plates 210, 250. The upper plate 210 and/or the lower plates 250 may be compressed within the end rails 302, 304 to allow the plates 210, 250 to move relative to each other. For example, the locating fingers 230, 232, 270, 272 may be movable within the spaces between the caps 310, 312, 314, 316.

Figure 7:
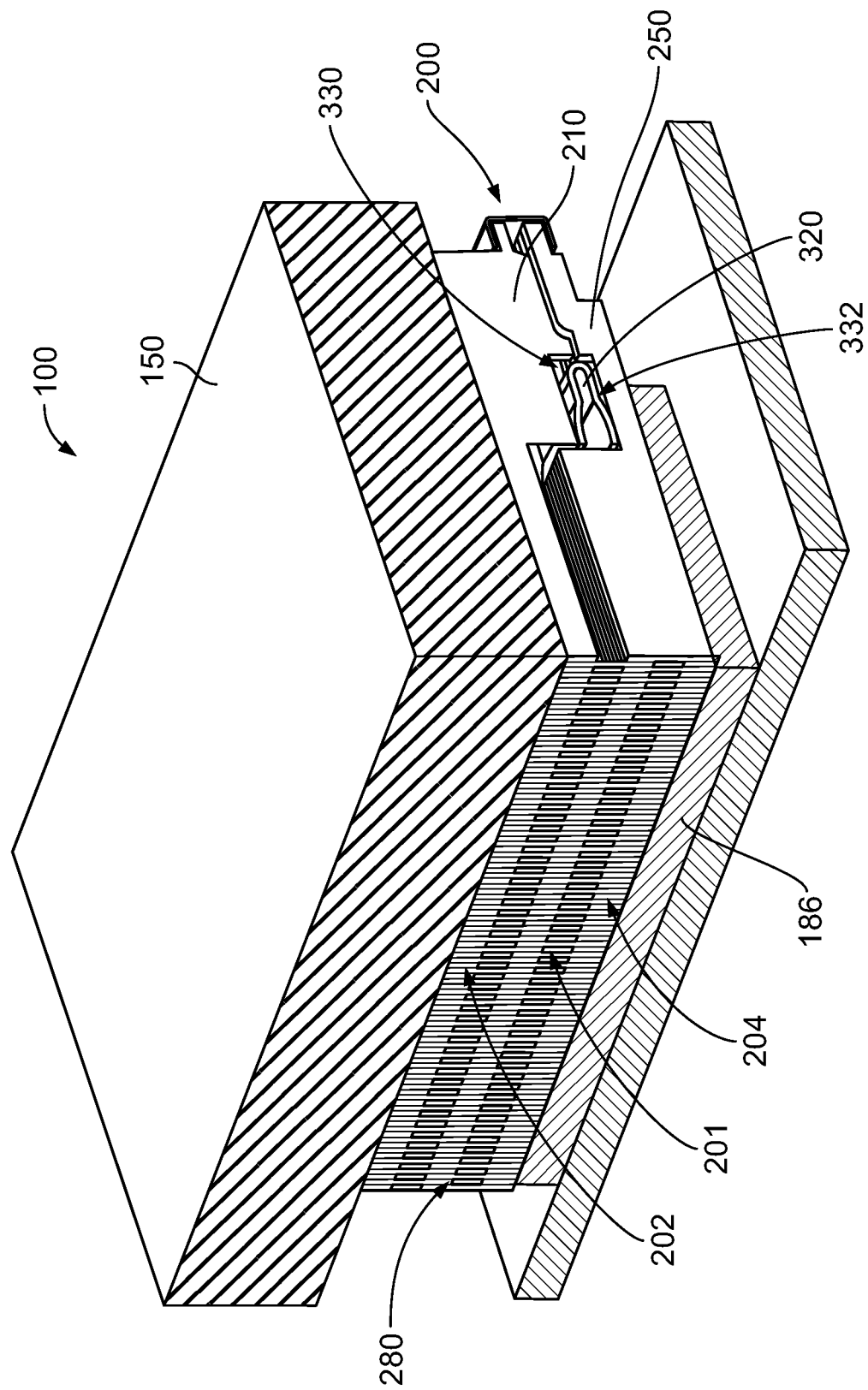
FIG. 7 is a side, elevational view of a portion of the communication system in accordance with an exemplary embodiment showing the heat exchange assembly thermally coupled between the electrical component and the thermal transfer device.

FIG. 7 is a side, elevational view of a portion of the communication system 100 in accordance with an exemplary embodiment showing the heat exchange assembly 200 thermally coupled between the thermal exchanger 186 and the thermal transfer device 150. The thermal bridge 201 thermally couples the thermal transfer device 150 with the thermal exchanger 186 to dissipate heat from the thermal exchanger 186. The upper bridge element 202 is thermally coupled to the lower bridge element 204 at the thermal bridge interface 280.

The spring elements 320 are positioned between the upper and lower bridge elements 202, 204 to press the upper bridge element 202 outward against the thermal transfer device 150. The spring elements 320 are positioned in the spring pockets 330, 332 between the upper plates 210 and the lower plates 250.

Figure 8:
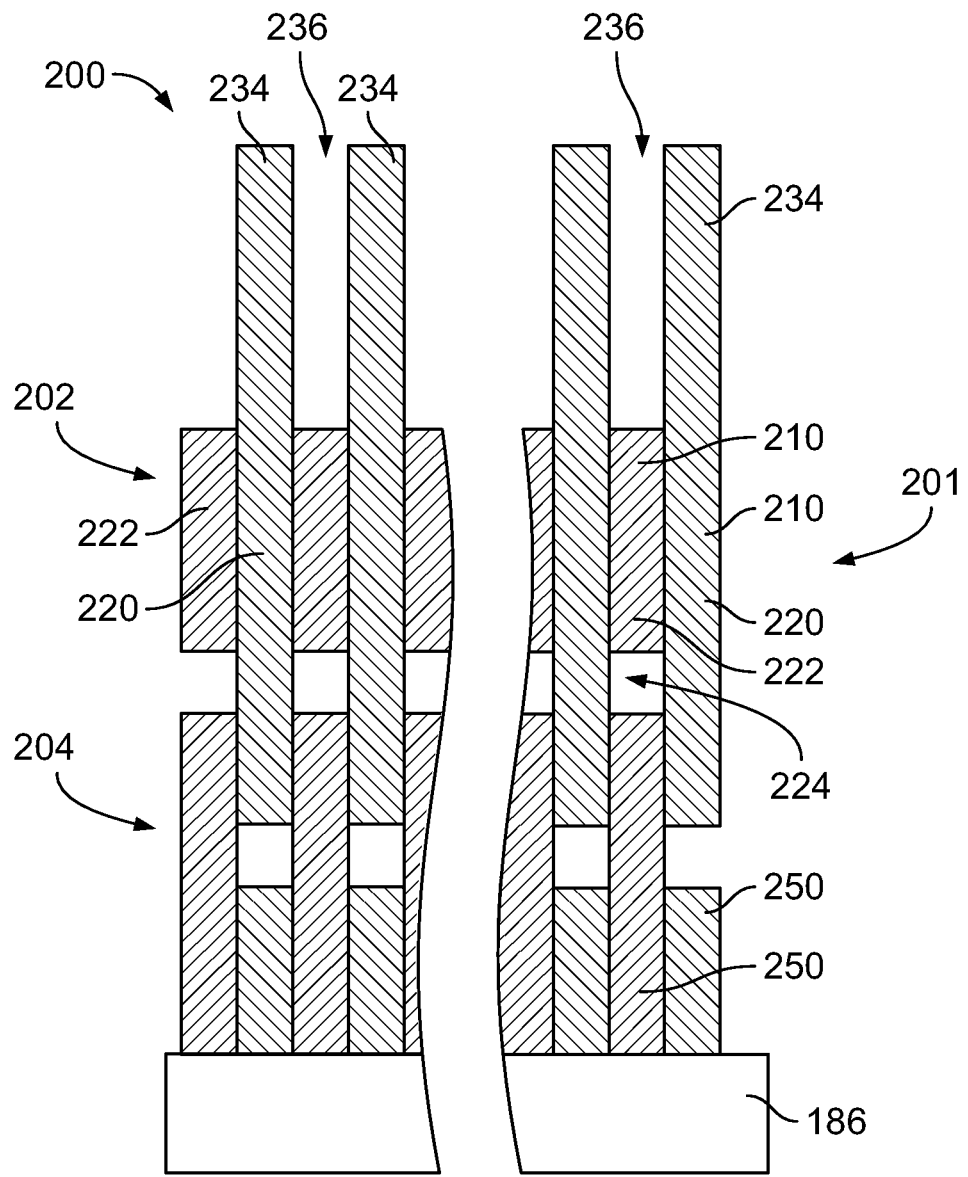
FIG. 8 is a cross-sectional view of the heat exchange assembly in accordance with an exemplary embodiment illustrating the heat exchange assembly configured to dissipate heat into the air rather than into a thermal transfer device.

FIG. 8 is a cross-sectional view of the heat exchange assembly 200 in accordance with an exemplary embodiment illustrating the heat exchange assembly configured to dissipate heat into the air rather than into a thermal transfer device 150 (shown in FIG. 6). The thermal bridge 201 of the heat exchange assembly 200 includes the upper bridge element 202 and the lower bridge element 204. The lower bridge element 204 is configured to thermally engage the thermal exchanger 186. The upper bridge element 202 includes heat dissipating fins 234 configured to dissipate heat into the air external of the receptacle cage 110. The heat dissipating fins 234 are separated by airflow channels 236 to allow air to flow between the heat dissipating fins 234. In an exemplary embodiment, the upper and lower bridge elements 202, 204 are movable relative to each other, such as to allow alignment of the upper and lower bridge elements 202, 204 with the thermal exchanger 186. The upper and lower bridge elements 202, 204 may be movable to allow thermal expansion and thermal contraction of the thermal exchanger 186 and/or the plates o the thermal bridge 201.

The bridge elements 202, 204 include the upper plates 210 and the lower plates 250 arranged in plate stacks. The plates 210, 250 are interleaved with each other for thermal communication between the upper bridge element 202 and the lower bridge element 204. The individual plates 210, 250 are movable relative to each other such that the plates 210, 250 may be individually articulated to conform to the upper surface of the thermal exchanger 186 for improved contact and/or proximity of the thermal bridge 201 with the thermal exchanger 186.

In an exemplary embodiment, the upper plates 210 include the upper fin plates 220 and the upper spacer plates 222. The upper spacer plates 222 are located between the upper fin plates 220. The upper spacer plates 222 are received in the upper channels 224 between the upper fin plates 220. The upper fin plates 220 include the heat dissipating fins 234 at the upper ends of the upper plates 210. The upper fin plates 220 extend above the upper ends of the upper spacer plates 222 to form the airflow channels 236.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A pluggable module configured to be plugged into a cage of receptacle assembly, the pluggable module comprising:
a housing having a top wall, a bottom wall and sidewalls between the top wall and the bottom wall, the housing forming a module cavity, the top wall having an opening above the module cavity, the housing having a mating end configured to be mated with a communication connector of the receptacle assembly;
a module circuit board received in the module cavity, the module circuit board having an electrical component mounted to an upper surface of the module circuit board; and
a heat exchange assembly separate and discrete from the housing, the heat exchange assembly being received in the opening and extending into the module cavity, the heat exchange assembly including a thermal bridge having an upper thermal interface and a lower thermal interface, the thermal bridge including a plurality of interleaved plates arranged in a plate stack with the plates being movable relative to each other in the plate stack, the lower thermal interface being in thermal communication with the electrical component to dissipate heat from the electrical component, the thermal bridge extending through the opening with the upper thermal interface exposed from above the housing for dissipating heat from the heat exchange assembly.

2. The pluggable module of claim 1, wherein the thermal bridge is flexible to conform to the electrical component to create a thermal path between the electrical component and the upper thermal interface.

3. The pluggable module of claim 1, wherein the thermal bridge is compressible to shift the relative positions of the lower thermal interface and the upper thermal interface.

4. The pluggable module of claim 1, wherein a front of the thermal bridge includes an angled ramp surface configured to engage at least one of the cage or the thermal transfer device to compress the thermal device.

5. The pluggable module of claim 1, wherein the thermal bridge includes an upper bridge element defining the upper thermal interface and a lower bridge element defining the lower thermal interface, the upper bridge element movable relative to the lower bridge element, the upper bridge element being thermally coupled to the lower bridge element.

6. The pluggable module of claim 5, wherein the upper bridge element includes upper plates arranged in an upper plate stack, the upper bridge element including upper channels between corresponding upper plates, and wherein the lower bridge element includes lower plates arranged in a lower plate stack, the lower bridge element including lower channels between corresponding lower plates, the lower plates being received in corresponding upper channels and the upper plates being received in corresponding lower channels to interleave the upper plates and the lower plates for thermal exchange between the lower bridge element and the upper bridge element.

7. The pluggable module of claim 6, wherein the upper plates include upper fin plates and upper spacer plates between corresponding upper fin plates, the upper spacer plates being shorter than the upper fin plates to define the upper channels between the upper fin plates, and wherein the lower plates include lower fin plates and lower spacer plates between corresponding lower fin plates, the lower spacer plates being shorter than the lower fin plates to define the lower channels between the lower fin plates, the upper fin plates being thermally coupled to the lower fin plates.

8. The pluggable module of claim 5, wherein the thermal bridge includes a spring element between the upper bridge element and the lower bridge element, the spring element biasing the upper bridge element away from the lower bridge element by a spring force, the spring force of the spring element being overcome to allow relative movement between the upper bridge element and the lower bridge element.

9. The pluggable module of claim 8, wherein the upper bridge element includes an upper spring pocket and the lower bridge element includes a lower spring pocket aligned with the upper spring pocket to receive the spring element.

10. The pluggable module of claim 5, wherein the thermal bridge includes a bridge frame holding the upper bridge element and the lower bridge element, the bridge frame allowing a limited amount of floating movement of at least one of the upper bridge element or the lower bridge element.

11. The pluggable module of claim 10, wherein the bridge frame includes a front end rail, a rear end rail, a first side rail between the front end rail and the rear end rail, and a second side rail between the front end rail and the rear end rail, the front end rail including a front pocket receiving upper front locating tabs of the upper bridge element and lower front locating tabs of the lower bridge element, the upper and lower front locating tabs being captured in the front pocket, the rear end rail including a rear pocket receiving upper rear locating tabs of the upper bridge element and lower rear locating tabs of the lower bridge element, the upper and lower rear locating tabs being captured in the rear pocket.

12. The pluggable module of claim 1, wherein the upper thermal interface is configured to interface with a thermal transfer device associated with the cage, the upper thermal interface being compressible toward the module cavity when interfacing with the thermal transfer device of the receptacle assembly.

13. The pluggable module of claim 1, wherein the upper thermal interface includes heat dissipating fins configured to extend exterior of the cage to dissipate heat into the external environment.

14. The pluggable module of claim 1, wherein the housing includes an upper shell and a lower shell, the upper shell defining the top wall, the lower shell defining the bottom wall, the electrical component being held between the upper shell and the lower shell, the heat exchange assembly being received in and held by the upper shell.

15. A pluggable module configured to be plugged into a cage of receptacle assembly, the pluggable module comprising:
a housing having a top wall, a bottom wall and sidewalls between the top wall and the bottom wall, the housing forming a module cavity, the top wall having an opening above the module cavity, the housing having a mating end configured to be mated with a communication connector of the receptacle assembly;
a module circuit board received in the module cavity, the module circuit board having an electrical component mounted to an upper surface of the module circuit board; and
a heat exchange assembly separate and discrete from the housing, the heat exchange assembly being received in the opening and extending into the module cavity, the heat exchange assembly including a thermal bridge having an upper bridge element and a lower bridge element movable relative to the upper bridge element and thermally coupled to the upper bridge element, the upper bridge element including upper plates arranged in an upper plate stack, the upper bridge element including upper channels between corresponding upper plates, the lower bridge element including lower plates arranged in an lower plate stack, the lower bridge element including lower channels between corresponding lower plates, the lower plates being received in corresponding upper channels and the upper plates being received in corresponding lower channels to interleave the upper plates and the lower plates for thermal exchange between the lower bridge element and the upper bridge element, the lower bridge element having a lower thermal interface being in thermal communication with the electrical component to dissipate heat from the electrical component, the upper bridge element extending through the opening and having an upper thermal interface exposed from above the housing for interfacing with a thermal transfer device associated with the cage, the upper bridge element being compressible toward the lower bridge element when interfacing with the thermal transfer device of the receptacle assembly.

16. The pluggable module of claim 15, wherein the thermal bridge is flexible to conform to the electrical component and to conform to the thermal transfer device to create a thermal path between the electrical component and the thermal transfer device.

17. The pluggable module of claim 15, wherein the thermal bridge is compressible to shift the upper thermal interface inward when interfacing with the thermal transfer device without moving the lower thermal interface.

18. The pluggable module of claim 15, wherein the upper plates include upper fin plates and upper spacer plates between corresponding upper fin plates, the upper spacer plates being shorter than the upper fin plates to define the upper channels between the upper fin plates, and wherein the lower plates include lower fin plates and lower spacer plates between corresponding lower fin plates, the lower spacer plates being shorter than the lower fin plates to define the lower channels between the lower fin plates, the upper fin plates being thermally coupled to the lower fin plates.

19. The pluggable module of claim 15, wherein the thermal bridge includes a spring element between the upper bridge element and the lower bridge element, the spring element biasing the upper bridge element away from the lower bridge element by a spring force, the spring force of the spring element being overcome when the upper bridge element interfaces with the thermal transfer device to compress the spring element and move the upper bridge element toward the lower bridge element.

20. The pluggable module of claim 15, wherein the thermal bridge includes a bridge frame holding the upper bridge element and the lower bridge element, the bridge frame allowing a limited amount of floating movement of the upper bridge element relative to the lower bridge element to allow compression of the upper bridge element when interfacing with the thermal transfer device.

21. A communication system comprising:
   a receptacle assembly having a cage and a thermal transfer device associated with the cage, the cage forming a module channel, the receptacle assembly having a communication connector received in the cage at a rear of the module channel; and
   a pluggable module received in the module channel and mated with the communication connector, the pluggable module comprising:
   a housing having a top wall, a bottom wall and sidewalls between the top wall and the bottom wall, the housing forming a module cavity, the top wall having an opening above the module cavity, the housing having a mating end mated with the communication connector of the receptacle assembly;
   a module circuit board received in the module cavity, the module circuit board having an electrical component mounted to an upper surface of the module circuit board, the module circuit board having an edge received in a card slot of the communication connector; and
   a heat exchange assembly separate and discrete from the housing, the heat exchange assembly being received in the opening and extending into the module cavity, the heat exchange assembly including a thermal bridge having an upper thermal interface and a lower thermal interface, the thermal bridge including a plurality of interleaved plates arranged in a plate stack with the plates being movable relative to each other in the plate stack, the lower thermal interface being in thermal communication with the electrical component to dissipate heat from the electrical component, the thermal bridge extending through the opening, the upper thermal interface exposed from above the housing for interfacing with the thermal transfer device associated with the cage, the upper thermal interface being compressible toward the module cavity when interfacing with the thermal transfer device of the receptacle assembly.

22. The communication system of claim 21, wherein the thermal bridge includes an upper bridge element defining the upper thermal interface and a lower bridge defining the lower thermal interface, the upper bridge element movable relative to the lower bridge element, the upper bridge element being thermally coupled to the lower bridge element, the upper bridge element being compressible downward when interfacing with the thermal transfer device, the upper bridge element including upper plates arranged in an upper plate stack, the upper bridge element including upper channels between corresponding upper plates, the lower bridge element including lower plates arranged in a lower plate stack, the lower bridge element including lower channels between corresponding lower plates, the lower plates being received in corresponding upper channels and the upper plates being received in corresponding lower channels to interleave the upper plates and the lower plates for thermal exchange between the lower bridge element and the upper bridge element.

* * * * *